United States Patent
Kim et al.

(10) Patent No.: US 9,134,365 B2
(45) Date of Patent: Sep. 15, 2015

(54) SYSTEM FOR TESTING SEMICONDUCTOR MODULES

(71) Applicant: Samsung Electronics Co., Ltd., Suwon-si (KR)

(72) Inventors: Min-Woo Kim, Cheonan-si (KR); Bae-Ki Lee, Cheonan-si (KR); Young-Soo Lee, Asan-si (KR); Hyung-Yun Lee, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 22 days.

(21) Appl. No.: 14/024,364

(22) Filed: Sep. 11, 2013

(65) Prior Publication Data

US 2014/0166544 A1 Jun. 19, 2014

(30) Foreign Application Priority Data

Dec. 14, 2012 (KR) ........................ 10-2012-0145862

(51) Int. Cl.
*B07C 5/08* (2006.01)
*G01R 31/28* (2006.01)
*G01R 31/26* (2014.01)
*G01R 31/18* (2006.01)

(52) U.S. Cl.
CPC ............ *G01R 31/2868* (2013.01); *G01R 31/18* (2013.01); *G01R 31/26* (2013.01); *G01R 31/2601* (2013.01); *G01R 31/2806* (2013.01); *G01R 31/2893* (2013.01)

(58) Field of Classification Search
CPC ............... G01R 31/26; G01R 31/2601; G01R 31/2893; G01R 31/18
USPC .......................................... 209/3.1, 556, 573
See application file for complete search history.

(56) References Cited

U.S. PATENT DOCUMENTS

| | | | |
|---|---|---|---|
| 6,075,216 A * | 6/2000 | Nakamura et al. | 209/573 |
| 6,248,967 B1 * | 6/2001 | Nakamura | 209/573 |
| 6,844,717 B2 | 1/2005 | Shim et al. | |
| 7,408,338 B2 | 8/2008 | Ham et al. | |
| 7,555,358 B2 * | 6/2009 | Jones et al. | 700/121 |
| 7,583,076 B2 * | 9/2009 | Kim et al. | 324/756.07 |
| 2003/0085160 A1 * | 5/2003 | Shim et al. | 209/573 |
| 2009/0153168 A1 | 6/2009 | Beom et al. | |

FOREIGN PATENT DOCUMENTS

| | | |
|---|---|---|
| KR | 1997-0049170 | 7/1997 |
| KR | 10-0380962 | 4/2003 |

(Continued)

*Primary Examiner* — Howard Sanders
(74) *Attorney, Agent, or Firm* — Onello & Mello, LLP.

(57) ABSTRACT

A system for testing semiconductor modules may include a first testing unit, a second testing unit, a classifying unit and a transferring unit. The first testing unit may test functions of the semiconductor modules mounted on a main board. The second testing unit may test the semiconductor modules tested by the first testing unit using a terminal. The classifying unit may classify the semiconductor modules tested by the second testing unit into normal semiconductor modules and abnormal semiconductor modules, or pass/fail. The transferring unit may be connected in-line between the first testing unit and the second testing unit, and between the second testing unit and the classifying unit to transfer the semiconductor modules from the first testing unit to the second testing unit and the classifying unit. Thus, the semiconductor modules may be automatically transferred to the units, so that a test time may be reduced.

20 Claims, 4 Drawing Sheets

(56) References Cited

FOREIGN PATENT DOCUMENTS

| | | |
|---|---|---|
| KR | 10-0402310 | 10/2003 |
| KR | 10-2005-0095202 | 9/2005 |
| KR | 10-2006-0019280 | 3/2006 |
| KR | 10-0629523 | 9/2006 |
| KR | 10-0683041 | 2/2007 |
| KR | 10-0694832 | 3/2007 |
| KR | 10-0881939 | 1/2009 |
| KR | 10-2009-0106438 | 10/2009 |
| KR | 10-0950034 | 3/2010 |
| KR | 10-2010-0057767 | 6/2010 |

* cited by examiner

FIG. 3

SYSTEM FOR TESTING SEMICONDUCTOR MODULES

CROSS-RELATED APPLICATION

This application claims priority under 35 USC §119 to Korean Patent Application No. 2012-145862, filed on Dec. 14, 2012 in the Korean Intellectual Property Office (KIPO), the contents of which are herein incorporated by reference in their entirety.

FIELD

The inventive concepts generally relate to systems and methods for testing semiconductor modules. In some example embodiments the inventive concepts relate to a system for testing semiconductor modules that may be mounted on a main board of a terminal such as a personal computer.

BACKGROUND

Generally, in order to test a semiconductor module mounted on a main circuit board, there is performed a computer process for testing functions of the semiconductor module. For example, a computer process for testing the semiconductor module can be performed using a computer terminal, such as a properly configured personal computer. According to such processes, the tested semiconductor modules are classified as either normal semiconductor modules or abnormal semiconductor modules.

The semiconductor modules may be manually transferred from one unit to another for performing the testing processes, where each unit can represent a different stage in the overall testing process. Thus, with the manual movement of a semiconductor module from one unit to another, the test processes may require a long time.

Further, the unit for testing the semiconductor module using the computer terminal may only accommodate the testing of one semiconductor module, so that the test processes may require a very long time. Particularly, there may exist difficulties in testing various kinds of the semiconductor modules.

SUMMARY

In accordance with various embodiments of the present invention, provided is a system for testing semiconductor modules that can significantly shorten a test time.

According to some aspects of the inventive concept, there may be provided a semiconductor modules testing system. The system may include a first testing unit, at least one second testing unit, a classifying unit, and a transferring unit. The first testing unit may be configured to test functions of the semiconductor modules mounted on a main board. The at least one second testing unit may be configured to test the semiconductor modules tested by the first testing unit using a terminal. The classifying unit may be configured to classify the semiconductor modules tested by the second testing unit into normal (or pass) semiconductor modules and abnormal (or fail) semiconductor modules. The transferring unit may be between the first testing unit and the at least one second testing unit, and between the at least one second testing unit and the classifying unit to transfer the semiconductor modules from the first testing unit to the at least one second testing unit and the classifying unit.

In various embodiments, the at least one second testing unit may be a plurality of second testing units.

In various embodiments, the second testing units may be connected the transferring unit in series.

In various embodiments, the second testing unit may be connected to the transferring in parallel.

In various embodiments, the transferring unit may include a ball screw connected between the first testing unit and each of the at least one second testing unit, and between the at least one second testing unit and the classifying unit, and a tray threadedly combined with the ball screw and configured to receive the semiconductor modules.

In various embodiments, the ball screw may be arranged in at least two rows.

In various embodiments, the transferring unit may further include a picker configured to load and unload the semiconductor modules into and from the tray.

In various embodiments, the system may further include a cutting unit and a rotating unit. The cutting unit may be configured to cut a printed circuit board (PCB) having the semiconductor modules to a plurality of divided semiconductor modules, e.g., into individual semiconductor modules. The rotating unit may be arranged between the cutting unit and the first testing unit and configured to vertically orient the semiconductor modules.

In various embodiments, the transferring unit may also be connected between the cutting unit and the rotating unit, and between the rotating unit and the first testing unit.

According to aspects of the inventive concepts, there may be provided a semiconductor modules testing system. The system may include a first testing unit, a plurality of second testing units, and a classifying unit. The first testing unit may be configured to test functions of the semiconductor modules mounted on a main board. The second testing units may be configured to test the semiconductor modules tested by the first testing unit using a terminal. The classifying unit may be configured to classify the semiconductor modules tested by the second testing unit into normal (or pass) semiconductor modules and abnormal (or fail) semiconductor modules. A transferring unit may be configured to pass the semiconductor modules from the first testing unit to each of the plurality of second testing units and then to the classifying unit.

In various embodiments, the second testing units may be connected the transferring unit in series.

In various embodiments, the second testing unit may be connected to the transferring in parallel.

In various embodiments, the system may further include a cutting unit and a rotating unit. The cutting unit may be configured to cut a printed circuit board (PCB) having the semiconductor modules to a plurality of divided semiconductor modules, e.g., individual semiconductor modules. The rotating unit may be arranged between the cutting unit and the first testing unit and configured to vertically orient the semiconductor modules.

In various embodiments, the transferring unit may be connected between the first testing unit and the second testing unit, and between the second testing unit and the classifying unit. Thus, the semiconductor modules may be automatically transferred to the units, so that a test time may be reduced. Further, the second testing units may be arranged using the transferring unit, so that the time for testing the numerous semiconductor modules may be remarkably reduced. Particularly, various kinds of the semiconductor modules may be tested in a short time.

In accordance with one aspect of the inventive concepts, provided is a transferring unit, for use with a semiconductor module testing system having a first testing unit configured to test functions of the semiconductor modules that are mounted on a main board, at least one second testing unit configured to test the semiconductor modules tested by the first testing unit using a terminal and a classifying unit configured to classify the semiconductor modules tested by the at least one second testing unit into normal semiconductor modules and abnormal semiconductor modules. The transferring unit is connected between the first testing unit and the at least one second testing unit and between the at least one second testing unit and the classifying unit and configured to transfer the semiconductor modules from the first testing unit to the at least one second testing unit and then to the classifying unit.

In various embodiments, the transferring unit may comprise a ball screw connected between the first testing unit and each of the at least one second testing unit and between the at least one second testing unit and the classifying unit and a tray threadedly combined with the ball screw and configured to receive the semiconductor modules.

In various embodiments, the ball screw may be arranged in at least two rows.

In various embodiments, the transferring unit may further comprise a picker configured to load and unload the semiconductor modules into and from the tray.

In various embodiments, the at least one second unit may be a plurality of second units arranged in series and the transferring unit is arranged between each of the second units.

In various embodiments, the at least one second unit may be a plurality of second units arranged in parallel and the transferring unit is arranged between each of the second units.

In accordance with aspects of the inventive concepts, provided is a system and method for testing semiconductor modules as shown in the drawings

BRIEF DESCRIPTION OF THE DRAWINGS

Aspects of the inventive concept will be more clearly understood from the following detailed description taken in conjunction with the accompanying drawings. The figures represent non-limiting, example embodiments, as described herein.

DETAILED DESCRIPTION OF THE EMBODIMENTS

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to idealized structures. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a feature illustrated as a rectangle may have rounded or curved features. Thus, the feature, parts, and components illustrated in the figures are schematic in nature and their shapes are not intended to illustrate the actual shape and are not intended to limit the scope of the present invention.

Hereinafter, example embodiments will be explained in detail with reference to the accompanying drawings.

Figure 1:
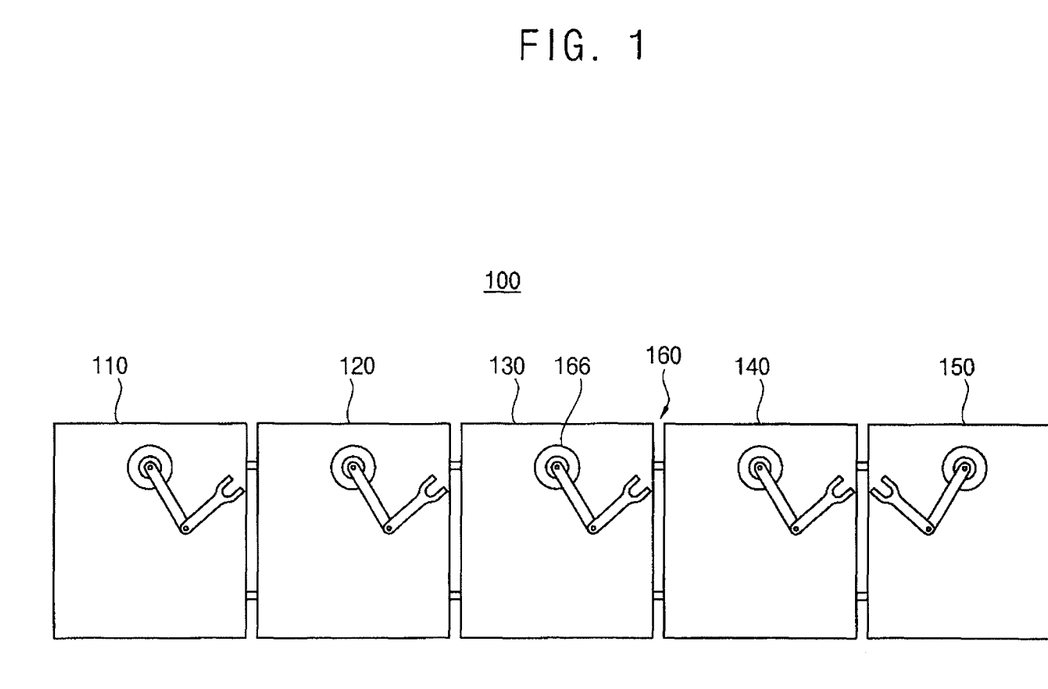
FIG. 1 is a plan view illustrating an embodiment of a system for testing semiconductor modules in accordance with aspects of the inventive concepts.
Figure 2:
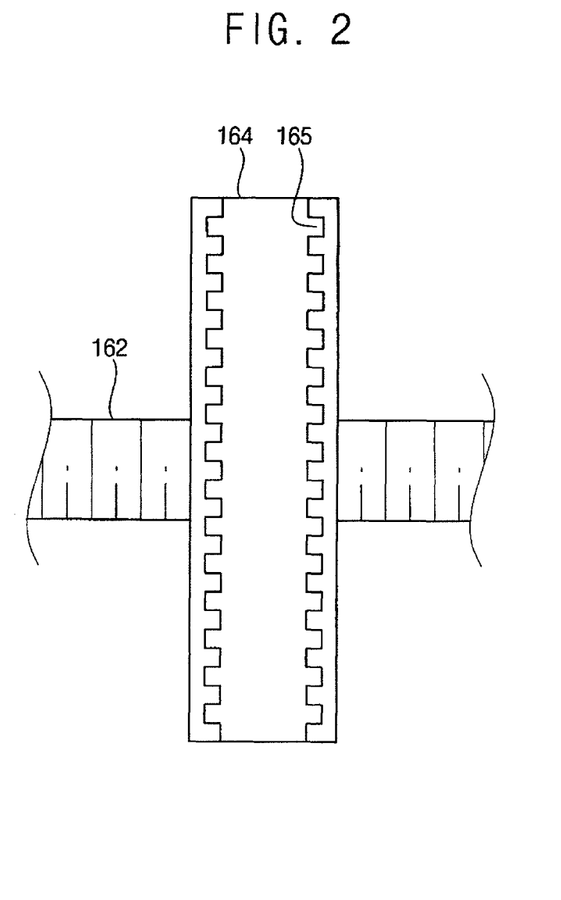
FIG. 2 is an enlarged plan view illustrating an embodiment of a transferring unit of the system in FIG. 1.

FIG. 1 is a plan view illustrating an embodiment of a system for testing semiconductor modules in accordance with aspects of the invention, and FIG. 2 is an enlarged plan view illustrating an embodiment of a transferring unit of the system in FIG. 1.

Referring to FIGS. 1 and 2, a system 100 for testing semiconductor modules may include a cutting unit 110, a rotating unit 120, a first testing unit 130, a second testing unit 140, a classifying unit 150 and a transferring unit 160. In example embodiments, the cutting unit 110, the rotating unit 120, the first testing unit 130, the second testing unit 140, and the classifying unit 150 may be sequentially or serially arranged. In FIG. 1, as an example, these units are sequentially arranged from left to right.

In various embodiments, the cutting unit 110 may be configured to cut a printed circuit board (PCB) on which the semiconductor modules may be mounted to divide the semiconductor modules, e.g., into individual semiconductor modules. The cutting unit 110 may have a function for automatically replacing a bit, which may be used to cut the PCB, by new one. Such bits are known in the art. Further, the cutting unit 110 may also be configured to measure dimensions of the PCB; scan a bar code of the PCB, and/or detect a bad semiconductor module of the PCB.

In various embodiments, the rotating unit 120 may be configured to rotate the semiconductor modules into a proper orientation by at least the first testing unit 120. Such orientation may be a vertical orientation, as an example. In the present embodiment, the vertically-oriented semiconductor modules may be tested in the first testing unit 130 and the second testing unit 140, thus the rotating unit 120 may rotate the semiconductor modules in a vertical direction before loading the semiconductor modules into the first testing unit 130. Further, the rotating unit 120 may be configured to classify semiconductor modules having abnormal appearances or having abnormal dimensions with respect to the other semiconductor modules. In some embodiment, the rotating unit 120 may also be configured to remove particles from the semiconductor modules.

Therefore, the first testing unit 130 may test functions of the vertically-oriented semiconductor modules mounted on a main board. The first testing unit 130 may also classify semiconductor modules having abnormal functions or characteristics (e.g., parameters).

In various embodiments, the second testing unit 140 may be configured to test the semiconductor modules using a terminal, such as a personal computer or workstation. Because the semiconductor modules may be vertically-oriented, the second testing unit 140 may be configured such that it is capable of testing a large number of the semiconductor modules.

In various embodiments, the classifying unit 150 may classify the semiconductor modules as normal semiconductor modules or abnormal semiconductor modules, based on test results by the first testing unit 130 and the second testing unit 140. In order to retest the abnormal semiconductor modules, the classifying unit 150 may reload the classified abnormal semiconductor modules into the second testing unit 140.

The transferring unit 160 may interconnect, e.g., serially connect in-line, the cutting unit 110, the rotating unit 120, the first testing unit 130, the second testing unit 140 and the classifying unit 150 with each other. That is, the transferring unit 160 may be arranged between the cutting unit 110 and the rotating unit 120, between the rotating unit 120 and the first testing unit 130, between the first testing unit 130 and the second testing unit 140, and between the second testing unit 140 and the classifying unit 150. The transferring unit 160 may automatically transfer the semiconductor modules from the cutting unit 110 to the classifying unit 150, through the rotating unit 120, the first testing unit 130 and the second testing unit 140.

In example embodiments, the transferring unit 160 may include a ball screw 162, a tray 164 and a picker 166, as shown in the example embodiment of FIG. 2. The ball screw 162 may be connected between the units 110, 120, 130, 140, and 150. Thus, the cutting unit 110, the rotating unit 120, the first testing unit 130, the second testing unit 140 and the classifying unit 150 may be connected in-line with each other via the ball screw 162. In order to rapidly transfer the semiconductor modules, the ball screw 162 may be arranged in at least two rows. The ball screw 162 may be rotated or reversely rotated by a driver, such as a motor. Alternatively, the transferring unit 160 may include other connecting members such as a conveyor in place of the ball screw 162.

The tray 164 may be threadedly combined with the ball screw 162. The tray 164 may be moved between the units 110, 120, 130, 140 and 150 by the rotation of the ball screw 162. The tray 164 may have an inner surface comprising a receiving groove 165. The receiving groove 165 may be configured to receive the semiconductor modules. Thus, the semiconductor modules may be inserted into the receiving groove 165. The semiconductor modules inserted into the receiving groove 165 may be transferred in the vertical (or erect) orientation.

The picker 166 may unload the semiconductor modules from the tray 164 to the cutting unit 110, the rotating unit 120, the first testing unit 130, the second testing unit 140 and the classifying unit 150. Similarly, the picker 166 may load the semiconductor modules into the tray 164 from the cutting unit 110, the rotating unit 120, the first testing unit 130, the second testing unit 140 and the classifying unit 150. In the example embodiment, the picker 166 includes at least one controllable arm having a gripper configured to hold the vertically-oriented semiconductor modules.

According to this example embodiment, the transferring unit may be arranged between the cutting unit 110, the rotating unit 120, the first testing unit 130, the second testing unit 140, and the classifying unit 150. Thus, the semiconductor modules may be automatically transferred between the units, so that a time for testing the semiconductor modules may be remarkably reduced. That is, the automated transfer by the transferring unit of the semiconductor modules vastly reduces overall testing time from the cutting unit 110 to the classifying unit 150.

Figure 3:
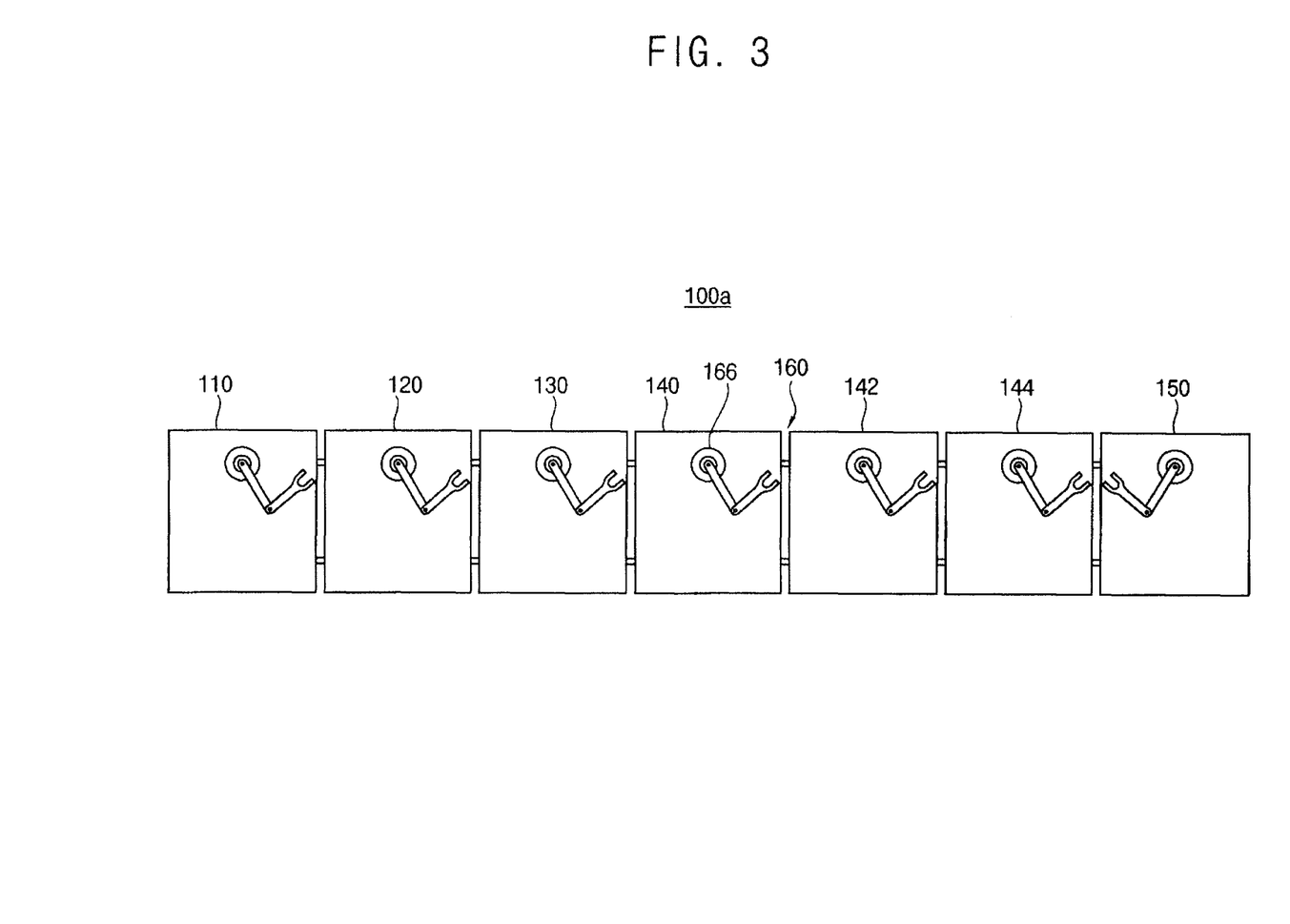
FIG. 3 is a plan view illustrating an embodiment of a system for testing semiconductor modules in accordance with aspects of the inventive concept.

FIG. 3 is a plan view illustrating an embodiment of a system for testing semiconductor modules, in accordance with aspects of the inventive concept.

A system 100a for testing semiconductor modules in accordance with this example embodiment may include elements substantially the same as those of the system 100 in FIG. 1, except for additional second testing units. Thus, the same reference numerals may refer to the same elements and any further illustrations with respect to the same element may be omitted herein for brevity.

Referring to FIG. 3, the system 100a may include a plurality of second testing units 140, 142 and 144. In example embodiments, the number second testing units 140, 142 and 144 may be, for example, three as shown in FIG. 2. In other embodiments, the number of second testing units may be two or at least four. In still other embodiments, the number of second testing units may be greater than 4.

In example embodiments, the second testing units 140, 142 and 144 may be arranged between the first testing unit 140 and the classifying unit 150 in series. The transferring unit 160 may also be arranged between the second testing units 140, 142 and 144. Thus, the second testing units 140, 142 and 144 may be connected in series via the transferring unit 160. The transferring unit 160 may transfer the semiconductor modules to a vacant second testing unit among the second testing units 140, 142 and 144. Therefore, the system 100a of this example embodiment may test semiconductor modules in number comparable to or greater than that of the system 100 in FIG. 1. And system 100a will achieve corresponding time savings in the testing of semiconductor modules from the cutting unit 110 to the classifying unit 150.

In example embodiments, a test condition for testing same type semiconductor modules may be set in the second testing units 140, 142 and 144. Alternatively, test conditions for testing different type semiconductor modules may be set in the second testing units 140, 142 and 144. In this case, the second testing units 140, 142 and 144 may simultaneously test the different type semiconductor modules.

According to this example embodiment, the second testing units may be connected in series via the transferring unit 160, as discussed above. Thus, a time for testing a large amount of the semiconductor modules may be more shortened. Particularly, the different type semiconductor modules may be tested in a shorter time than would be possible without transferring unit 160.

Figure 4:
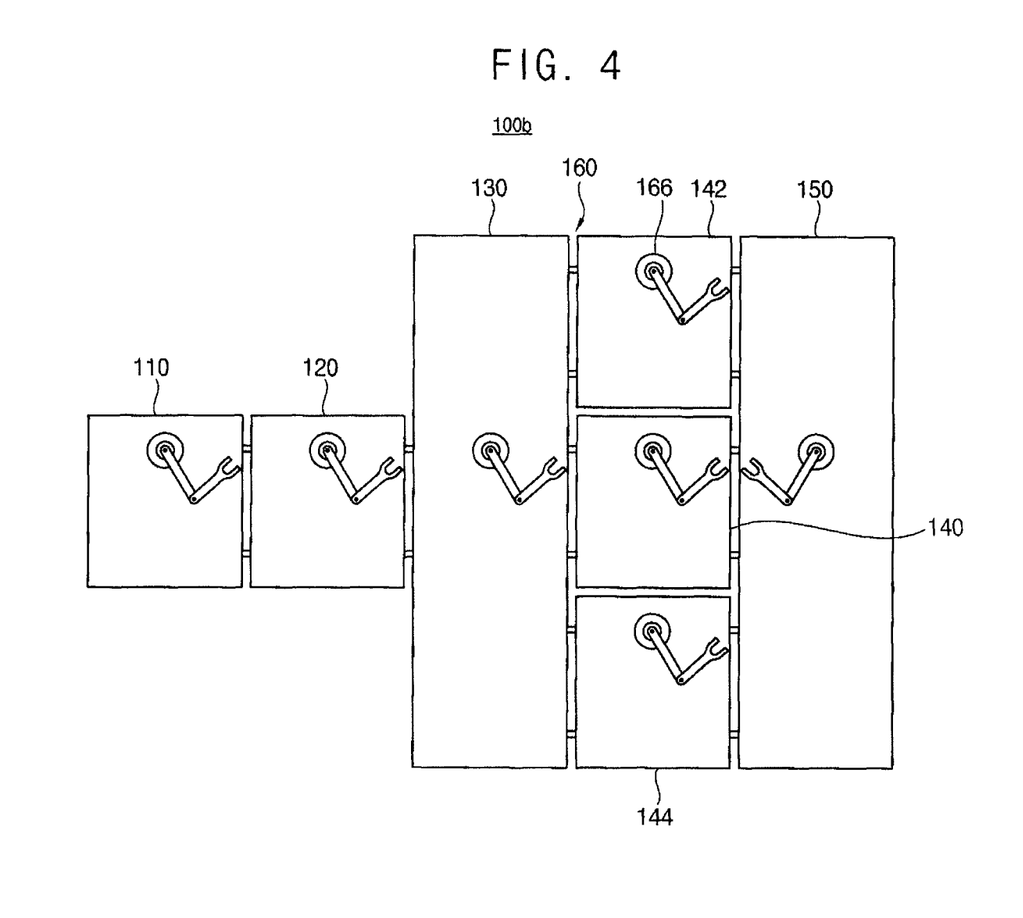
FIG. 4 is a plan view illustrating an embodiment of a system for testing semiconductor modules in accordance with aspects of the inventive concept.

FIG. 4 is a plan view illustrating yet another embodiment of a system for testing semiconductor modules in accordance with aspects of the inventive concept.

A system 100b for testing semiconductor modules in accordance with this example embodiment may include elements substantially the same as those of the system 100 in FIG. 1 except for a second testing unit. Thus, the same reference numerals may refer to the same elements and any further illustrations with respect to the same element may be omitted herein for brevity.

Referring to FIG. 4, the system 100b may include a plurality of second testing units 140, 142 and 144. In example embodiments, the number of second testing units 140, 142 and 144 may be three, as shown. Alternatively, the number of second testing units may be two or at least four. In other embodiments, the number of second testing units may be greater than 4.

In example embodiments, the second testing units 140, 142 and 144 may be arranged between the first testing unit 140 and the classifying unit 150 in parallel, as opposed to being in series as in FIG. 3. The transferring unit 160 may connect each of the second testing units 140, 142 and 144 with the first testing unit 130 and the classifying unit 150. The transferring unit 160 may transfer the semiconductor modules to a vacant second testing unit among the second testing units 140, 142 and 144. First testing unit 130, classifying unto 150 and transferring unit 160 may be configured to couple to and interact with the parallel-arranged second testing units 140, 142, and 144. Therefore, the system 100b of this example embodiment may test semiconductor modules in number comparable or greater than that of the system 100 in FIG. 1.

In example embodiments, a test condition for testing same type semiconductor modules may be set in the second testing units 140, 142 and 144. Alternatively, test conditions for testing different type semiconductor modules may be set in the second testing units 140, 142 and 144. In this case, the second testing units 140, 142 and 144 may simultaneously test the different type semiconductor modules.

According to this example embodiment, the second testing units 140, 142 and 144 may be connected in parallel via the transferring unit 160. Thus, a time for testing a great amount of the semiconductor modules may be further shortened. Particularly, the different type semiconductor modules may be tested in a short time.

According to example embodiments, the transferring unit may be connected between the first testing unit and the second testing unit, and between the second testing unit and the classifying unit. Thus, the semiconductor modules may be automatically transferred to the units, so that a test time may be reduced. Further, the second testing units may be arranged using the transferring unit, so that the time for testing the numerous semiconductor modules may be remarkably reduced. Particularly, various kinds of the semiconductor modules may be tested in a short time.

The foregoing is illustrative of example embodiments and is not to be construed as limiting of the inventive concept. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents, but also equivalent structures.

What is claimed is:

1. A semiconductor modules testing system, the system comprising:
    a first testing unit configured to test functions of the semiconductor modules that are mounted on a main board;
    at least one second testing unit configured to test the semiconductor modules tested by the first testing unit using a terminal;
    a classifying unit configured to classify the semiconductor modules tested by the at least one second testing unit into normal semiconductor modules and abnormal semiconductor modules; and
    a transferring unit connected between the first testing unit and the at least one second testing unit and between the at least one second testing unit and the classifying unit and configured to automatically transfer the semiconductor modules in a vertical orientation from the first testing unit to the at least one second testing unit and then to the classifying unit, the transferring unit comprising a tray having a plurality of grooves configured to receive and maintain the semiconductor modules in the vertical orientation during transfer.

2. The system of claim 1, wherein the at least one second testing unit is a plurality of second testing units.

3. The system of claim 2, wherein the second testing units are connected with each other in series.

4. The system of claim 2, wherein the second testing units are connected with each other in parallel.

5. The system of claim 1, wherein the transferring unit comprises:
    a ball screw connected between the first testing unit and each of the at least one second testing unit and between the at least one second testing unit and the classifying unit,
    wherein the tray is threadedly combined with the ball screw and configured to receive the semiconductor modules in the vertical orientation.

6. The system of claim 5, wherein the ball screw is arranged in at least two rows.

7. The system of claim 5, wherein the transferring unit further comprises a picker configured to load and unload the semiconductor modules into and from the tray.

8. The system of claim 1, further comprising:
    a cutting unit configured to cut a printed circuit board (PCB) having the semiconductor modules to divide the semiconductor modules into a plurality of semiconductor modules; and
    a rotating unit arranged between the cutting unit and the first testing unit and configured to vertically orient the semiconductor modules in the tray.

9. The system of claim 8, wherein the transferring unit is connected between the cutting unit and the rotating unit and between the rotating unit and the first testing unit.

10. A semiconductor modules testing system, the system comprising:
   a first testing unit configured to test functions of the semiconductor modules that are mounted on a main board;
   a plurality of second testing units configured to test the semiconductor modules tested by the first testing unit using a terminal; and
   a classifying unit configured to classify the semiconductor modules tested by the plurality of second testing units into normal semiconductor modules and abnormal semiconductor modules; and
   a transferring unit configured to automatically pass the semiconductor modules in a vertical orientation from the first testing unit to each of the plurality of second testing units and then to the classifying unit, the transferring unit comprising a tray having a plurality of grooves configured to receive and maintain the semiconductor modules in the vertical orientation during transfer.

11. The system of claim 10, wherein the second testing units are connected with each other in series.

12. The system of claim 10, wherein at least some of the second testing units are connected with each other in parallel.

13. The system of claim 10, further comprising:
   a cutting unit configured to cut a printed circuit board (PCB) having the semiconductor modules to divide the semiconductor modules into individual semiconductor modules; and
   a rotating unit arranged between the cutting unit and the first testing unit and configured to vertically orient the semiconductor modules in the tray.

14. The system of claim 10, wherein the transferring unit is connected between the first testing unit and the second testing units and between the second testing units and the classifying unit.

15. A transferring unit, for use with a semiconductor module testing system having:
   a first testing unit configured to test functions of the semiconductor modules that are mounted on a main board;
   at least one second testing unit configured to test the semiconductor modules tested by the first testing unit using a terminal; and
   a classifying unit configured to classify the semiconductor modules tested by the at least one second testing unit into normal semiconductor modules and abnormal semiconductor modules;
   the transferring unit connected between the first testing unit and the at least one second testing unit and between the at least one second testing unit and the classifying unit and configured to automatically transfer the semiconductor modules in a vertical orientation from the first testing unit to the at least one second testing unit and then to the classifying unit, the transferring unit comprising a tray having a plurality of grooves configured to receive and maintain the semiconductor modules in the vertical orientation during transfer.

16. The transferring unit of claim 15, comprising:
   a ball screw connected between the first testing unit and each of the at least one second testing unit and between the at least one second testing unit and the classifying unit,
   wherein the tray is threadedly combined with the ball screw and configured to receive the semiconductor modules in the vertical orientation.

17. The transferring unit of claim 16, wherein the ball screw is arranged in at least two rows.

18. The transferring unit of claim 16, wherein the transferring unit further comprises a picker configured to load and unload the semiconductor modules into and from the tray.

19. The transferring unit of claim 15, wherein the at least one second unit is a plurality of second units arranged in series and the transferring unit is arranged between each of the second units.

20. The transferring unit of claim 15, wherein the at least one second unit is a plurality of second units arranged in parallel and the transferring unit is arranged between each of the second units.

* * * * *